US009576524B2

(12) United States Patent
Kim et al.

(10) Patent No.: US 9,576,524 B2
(45) Date of Patent: Feb. 21, 2017

(54) SHIFT REGISTER UNIT, SHIFT REGISTER CIRCUIT, ARRAY SUBSTRATE AND DISPLAY DEVICE

(71) Applicant: BOE Technology Group Co., Ltd., Beijing (CN)

(72) Inventors: Tae Gyu Kim, Beijing (CN); Pil Seok Kim, Beijing (CN); Ying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 376 days.

(21) Appl. No.: 13/978,296

(22) PCT Filed: Dec. 11, 2012

(86) PCT No.: PCT/CN2012/086326
§ 371 (c)(1),
(2) Date: Jul. 3, 2013

(87) PCT Pub. No.: WO2013/177918
PCT Pub. Date: Dec. 5, 2013

(65) Prior Publication Data
US 2014/0111403 A1    Apr. 24, 2014

(30) Foreign Application Priority Data

May 31, 2012   (CN) .......................... 2012 1 0177631

(51) Int. Cl.
*G09G 3/32* (2016.01)
*G11C 19/28* (2006.01)
*G11C 19/18* (2006.01)

(52) U.S. Cl.
CPC .......... *G09G 3/3208* (2013.01); *G09G 3/3266* (2013.01); *G11C 19/184* (2013.01);
(Continued)

(58) Field of Classification Search
CPC ..................... G09G 2310/0286; G09G 3/3266; G09G 3/3674
See application file for complete search history.

(56) References Cited

U.S. PATENT DOCUMENTS 7,688,934 B2 *   3/2010   Tsai et al. ....................... 377/64
8,121,244 B2     2/2012   Kim
(Continued)

FOREIGN PATENT DOCUMENTS

CN      101136185 A     3/2008
CN      101241765 A     8/2008
(Continued)

OTHER PUBLICATIONS

International Search Report (Chinese language) issued by the International Searching Authority, rendered May 31, 2012, 14 pages.
(Continued)

*Primary Examiner* — Amare Mengistu
*Assistant Examiner* — Shawna Stepp Jones
(74) *Attorney, Agent, or Firm* — Ladas & Parry LLP

(57) ABSTRACT

A shift register unit, a shift register circuit, an array substrate and a display device are provided. The present disclosure relates to the field of display device manufacture, and can prevent an OLED device from flickering while writing display data. A shift register comprises a first pull-up unit, connected with a high level end, a first clock signal end and a first control node (A); a first pull-down unit, connected with a low level end, a second clock signal end, an input signal end, the first pull-up unit, a first output end and the first control node (A); a pull-down switch unit, connected with the high level end, the low level end, the first clock signal end, the second clock signal end and a second control node (B); a second pull-down unit, connected with the low level end, the second control node (B) and a second output (Continued)

end; and a second pull-up unit, connected with the high level end, the first control node (A) and the second output end.

7 Claims, 7 Drawing Sheets

(52) U.S. Cl.
CPC ..... *G11C 19/28* (2013.01); *G09G 2310/0286* (2013.01); *G09G 2320/0247* (2013.01)

(56) References Cited

U.S. PATENT DOCUMENTS

| | | | |
|---|---|---|---|
| 2008/0055225 A1 | 3/2008 | Pak et al. | |
| 2008/0074359 A1* | 3/2008 | Chung | 345/76 |
| 2008/0191994 A1 | 8/2008 | Chiang et al. | |
| 2009/0304138 A1 | 12/2009 | Tsai et al. | |
| 2010/0007635 A1 | 1/2010 | Kwon et al. | |
| 2010/0177068 A1 | 7/2010 | Shih et al. | |
| 2010/0226473 A1 | 9/2010 | Liu et al. | |
| 2011/0134107 A1* | 6/2011 | Lebrun | G11C 19/28 345/213 |
| 2014/0111403 A1 | 4/2014 | Kim et al. | |

FOREIGN PATENT DOCUMENTS

| | | |
|---|---|---|
| CN | 101625838 A | 1/2010 |
| CN | 101625841 A | 1/2010 |
| CN | 101697284 A | 4/2010 |
| CN | 102201194 A | 9/2011 |
| CN | 102708799 A | 10/2012 |
| TW | 200951937 A | 12/2009 |
| TW | 201033978 A1 | 9/2010 |

OTHER PUBLICATIONS

The State Intellectual Property Office of the People's Republic of China ("SIPO") (Chinese Language) Office Action issued on Jan. 24, 2014 by SIPO in Chinese Patent Application No. 201210177631.1; eight (8) pages.
English Translation of The State Intellectual Property Office of the People's Republic of China ("SIPO") Office Action issued on Jan. 24, 2014 by SIPO in Chinese Patent Application No. 201210177631.1; five (5) pages.
English abstract of CN102201194(A) listed above, 17 pages.
English abstract of CN102708799(A) listed above, 23 pages.
English abstract of CN101136185(A) listed above, 26 pages.
English abstract of TW200951937(A) listed above, 23 pages.
English abstract of CN101241765(A) listed above, 18 pages.
English abstract of CN101625841(A) listed above, 21 pages.
English abstract of CN101625838(A) listed above, 34 pages.
English abstract of CN101697284(A) listed above, 40 pages.
English abstract of TW201033978(A) listed above, 11 pages.
The International Bureau of WIPO, International Preliminary Report on Patentability issued on Dec. 2, 2014 for international application No. PCT/CN2012/086326; 6 pages.

* cited by examiner

US 9,576,524 B2

SHIFT REGISTER UNIT, SHIFT REGISTER CIRCUIT, ARRAY SUBSTRATE AND DISPLAY DEVICE

CROSS REFERENCE TO RELATED APPLICATIONS

This application is based on International Application No. PCT/CN2012/086326 filed on Dec. 11, 2012, which claims priority to Chinese National Application No. 201210177631.1 filed on May 31, 2012, the contents of which are incorporated herein by reference.

TECHNICAL FIELD

The present disclosure relates to the field of display device manufacture, particularly to a shift register unit, a shift register circuit, an array substrate and a display device.

BACKGROUND

With the continuous development of display technology, development of a display in recent years gradually shows a development trend of high integration and low cost. A kind of very important technology therein is implementation of mass production of GOA (Gate Driver on Array) technology. By using the GOA technology, a TFT (Thin Film Transistor) gate switch circuit is integrated on an array substrates of a display panel to form a scanning driver for the display panel, thereby capable of omitting the IC part for a gate driver. This can not only lower product cost in both of material cost and manufacturing process, but also enable the display panel to have a beautiful design of two symmetrical sides and a narrow border. In the meantime, since a process for bonding in the direction of the Gate can be omitted, it is useful for increasing productivity and a yield rate. This kind of gate switch circuit being integrated on an array substrate by using the GOA technology is also referred to as a GOA circuit or a shift register circuit.

Since the GOA circuit has the above mentioned advantages, the current OLED (Organic Light-Emitting Diode) display has increasingly used the GOA circuit as a row gating control signal of the gate of a pixel circuit array TFT. For the OLED display, since an OLED is a current driving device, the light emission of the OLED device can be controlled by controlling a current channel into the OLED device. In order to perform accurate control on the driving current of the OLED device, a driving TFT is usually added on the basis of a pixel circuit to perform accurate control on the driving current of the OLED device.

The disadvantage of this kind of circuit consists in that when a driving current is inputted to the OLED device at the moment when the GOA circuit drives a pixel circuit, which results in that there occurs a flicker in the OLED display device while writing display data, thus affecting the quality of the product.

SUMMARY

The embodiments of the present disclosure provide a shift register unit, a shift register circuit, an array substrate and a display device, which can prevent the OLED display device from flickering while writing display data.

In order to achieve the above object, the embodiments of the present disclosure adopt the following technical solutions.

According to an aspect of the embodiments of the present disclosure, there is provided a shift register unit comprising:
a first pull-up unit connected with a high level end, a first clock signal end and a first control node A;
a first pull-down unit connected with a low level end, a second clock signal end, an input signal end, the first pull-up unit, a first output end and the first control node A;
a pull-down switch unit connected with the high level end, the low level end, the first clock signal end, the second clock signal end and a second control node B;
a second pull-down unit connected with the low level end, the second control node B and a second output end; and
a second pull-up unit connected with the high level end, the first control node A and the second output end;
wherein, the first pull-up unit is used to pull up a level of the first control node A when a low level is inputted into the first clock signal end; the first pull-down unit is used to pull down the level of the first control node A when a low level is inputted into both of the second clock signal end and the input signal end, respectively; the pull-down switch unit is used to pull down a level of the second control node B when a low level is inputted into the first clock signal end, and pull up the level of the second control node B when a low level is inputted into the second clock signal end; the second pull-up unit is used to pull up a level outputted from the second output end when the first control node A is at a low level, to output a driving signal; and the second pull-down unit is used to pull down the level outputted from the second output end when the second control node B is at a low level, to reset the driving signal.

The first pull-up unit comprises:
a first pull-up module connected with the high level end, the first clock signal end and a third control node C;
a second pull-up module connected with the high level end, the first clock signal end and a fourth control node D; and
a third pull-up module connected with the high level end, the first clock signal end and the first control node A,
correspondingly, the first pull-down unit comprises:
a first pull-down module connected with the input signal end and the third control node C;
a second pull-down module connected with the second clock signal end, the third control node C and the fourth control node D; and
a third pull-down module connected with the low level end, the fourth control node D and the first control node A,
wherein the first output end is connected with the fourth control node D.

The first pull-up module comprises a first transistor having a gate connected with the first clock signal end, having a source connected with the high level end and having a drain connected with the third control node C.
the second pull-up module comprises a second transistor having a gate connected with the first clock signal end, having a source connected with the high level end and having a drain connected with the fourth control node D.
the third pull-up module comprises a third transistor having a gate connected with the first clock signal end, having a source connected with the high level end and having a drain connected with the first control node A.
the first pull-down module comprises a fourth transistor having a gate and source connected with the input signal end, and having a drain connected with the third control node C.
the second pull-down module comprises a fifth transistor and a first capacitor, a gate of the fifth transistor is connected with the third control node C, a source of the fifth transistor is connected with the second clock signal end, a drain of the fifth transistor is connected with the fourth control node D, and two ends of the first capacitor are connected with the gate and the source of the fifth transistor, respectively.

the third pull-down module comprises a sixth transistor and a second capacitor, a gate of the sixth transistor is connected with the fourth control node D, a source of the sixth transistor is connected with the low level end, a drain of the sixth transistor is connected with the first control node A, and two ends of the second capacitor are connected with the source and the drain of the sixth transistor, respectively.

the pull-down switch unit comprises a seventh transistor and an eighth transistor, a gate of the seventh transistor is connected with the first clock signal end, a source of the seventh transistor is connected with the low level end, a drain of the seventh transistor is connected with the second control node B, a gate of the eighth transistor is connected with the second clock signal end, a source of the eighth transistor is connected with the high level end, and a drain of the eight transistor is connected with the second control node B.

the second pull-down unit comprises a ninth transistor and a third capacitor, a gate of the ninth transistor is connected with the second control node B, a source of the ninth transistor is connected with the low level end, a drain of the ninth transistor is connected with the second output end, and two ends of the third capacitor are connected with the source and the drain of the ninth transistor, respectively.

the second pull-up unit comprises a tenth transistor and a fourth capacitor, a gate of the tenth transistor is connected with the first control node A, a source of the tenth transistor is connected with the high level end, a drain of the tenth transistor is connected with the second output end, and two ends of the fourth capacitor are connected with the drain of the tenth transistor and the drain of the eight transistor, respectively.

According to another aspect of the embodiments of the present disclosure, there is provided a shift register circuit, comprising a plurality of the above mentioned shift register units connected in series.

Except a first shift register unit, an input signal of each of the other shift register units comes from a signal outputted from a first output end of an adjacent shift register unit before the shift register unit.

The shift register circuit comprises a first shift register unit set and a second shift register unit set, each of the shift register unit sets comprises a plurality of the shift register units connected in series.

In each of the shift register unit sets, except a first shift register unit, an input signal of each of the other shift register units comes from a signal outputted from a first output end of an adjacent shift register unit before the shift register unit.

Clock signals inputted into the first shift register unit set comprise a first clock signal and a second clock signal.

Clock signals inputted into the second shift register unit set comprise a third clock signal and a fourth clock signal.

The first clock signal is a half clock period apart from the third clock signal.

The second clock signal is a half clock period apart from the fourth clock signal.

According to another aspect of the embodiments of the present disclosure, there is provided an array substrate on which are formed the above mentioned shift register circuit.

According to another aspect of the embodiments of the present disclosure, there is provided a display device, comprising:

OLED display means for displaying an image; and a shift register circuit for driving the OLED display means, and the shift register circuit is the above mentioned shift register circuit.

The embodiments of the present disclosure provide a shift register unit, a shift register circuit, an array substrate and a display device, wherein, the shift register unit is used to control a driving TFT for driving an OLED device to coordinate with an existing shift register unit for controlling a pixel circuit, control the driving TFT to turn off the driving current of the OLED device when the shift register unit for controlling the pixel circuit writes data into the pixel circuit, and control the driving TFT again to turn on the OLED device when the writing of the data is finished. As such, a problem of flickers can be prevented from occurring in the OLED display device while writing display data, and the product quality of the OLED display device is enhanced.

BRIEF DESCRIPTION OF THE DRAWINGS

In order to describe more clearly technical solutions according to the embodiments of the present disclosure or the prior art, drawings needed in the description of the embodiments or the prior art will be introduced briefly. Obviously, the figures in the following description are merely some embodiments of the present disclosure, and for those of ordinary skill in the art, other figures can further be obtained according to these figures without inventive works.

DETAILED DESCRIPTION

The technical solutions in the embodiments of the present disclosure will be described clearly and completely below in conjunction with the drawings in the embodiments of the present disclosure. Obviously, the described embodiments are merely a part of the embodiment instead of all the embodiments. Based on the embodiments of the present disclosure, all other embodiments obtained by those of ordinary skill in the art without inventive works belong to the scope protected by the present disclosure.

All transistors adopted in all the embodiments of the present disclosure can be thin film transistor, FETs or other devices having identical characteristics. Since the source and the drain of the transistor adopted here are symmetrical, its source and drain have no difference. In the embodiments of the present disclosure, in order to differentiate the two electrodes except the gate, of the transistor, one of them is called a source and the other one is called a drain. It is prescribed according to the form in the figures that, the central end of the transistor is the gate, the signal input end is the source and the signal output end is the drain. In addition, all the transistors adopted in the embodiments of the present disclosure are P type transistor, that is, they are turned on when the gate is at a low level.

Figure 1:
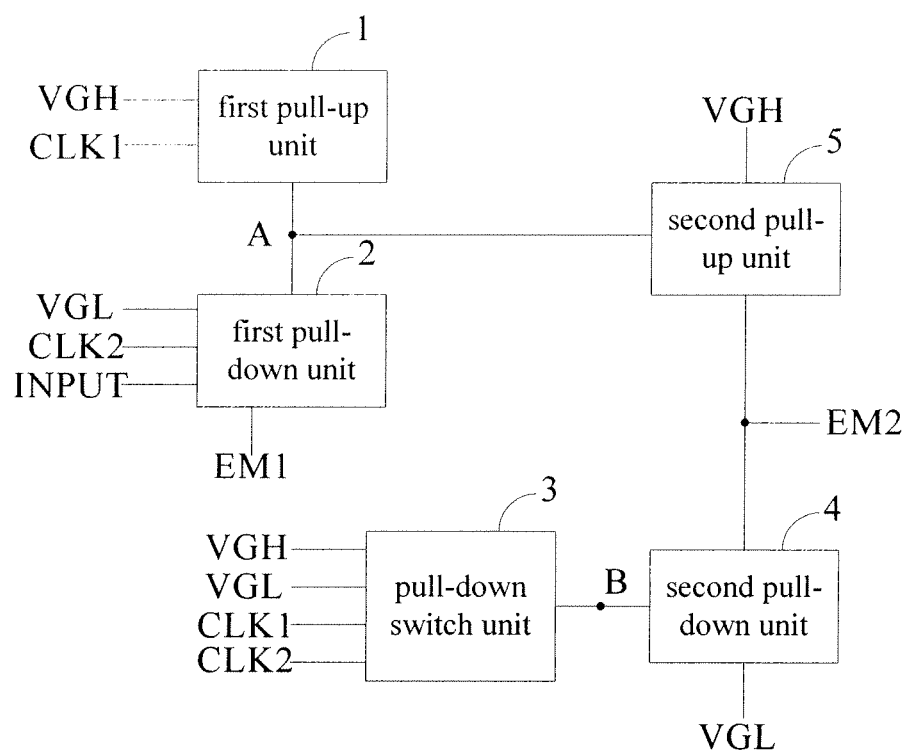
FIG. 1 is a structural schematic diagram of a shift register unit according an embodiment of the present disclosure.

The structure of a shift register according to the embodiments of the present disclosure is as shown in FIG. 1, comprising:

A first pull-up unit 1 connected with a high level end VGH, a first clock signal end CLK1 and a control node A.

A first pull-down unit 2 connected with a low level end VGL, a second clock signal end CLK2, an input signal end INPUT, the first pull-up unit 1, a first output end EM1 and the control node A.

A pull-down switch unit 3 connected with the high level end VGH, the low level end VGL, the first clock signal end CLK1, the second clock signal end CLK2 and a control node B.

A second pull-down unit 4 connected with the low level end VGL, the control node B and the second output end EM2.

A second pull-up unit 5 connected with the high level end VGH, the control node A and the second output end EM2.

Wherein, the first pull-up unit 1 is used to pull up a level of the control node A when a low level is inputted into the first clock signal end CLK1; the first pull-down unit 2 is used to pull down the level of the control node A when a low level is inputted into both of the second clock signal end CLK2 and the input signal end INPUT, respectively; the pull-down switch unit 3 is used to pull down a level of the control node B when a low level is inputted into the first clock signal end CLK1, and pull up the level of the control node B when a low level is inputted into the second clock signal end CLK2; the second pull-up unit 5 is used to pull up a level outputted from the second output end EM2 when the control node A is at a low level, to output a driving signal; and the second pull-down unit 4 is used to pull down the level outputted from the second output end EM2 when the control node B is at a low level, to reset the driving signal.

The shift register unit according to the embodiments of the present disclosure is used to control a driving TFT for driving an OLED device, coordinate with an existing shift register unit for controlling a pixel circuit, control the driving TFT to turn off the driving current of the OLED device when the shift register unit for controlling the pixel circuit writes data into the pixel circuit, and control the driving TFT again to turn on the OLED device when the writing of the data is finished. As such, a problem of flickers can be prevented from occurring in the OLED display device while writing display data, and the product quality of the OLED display device is enhanced.

Figure 2:
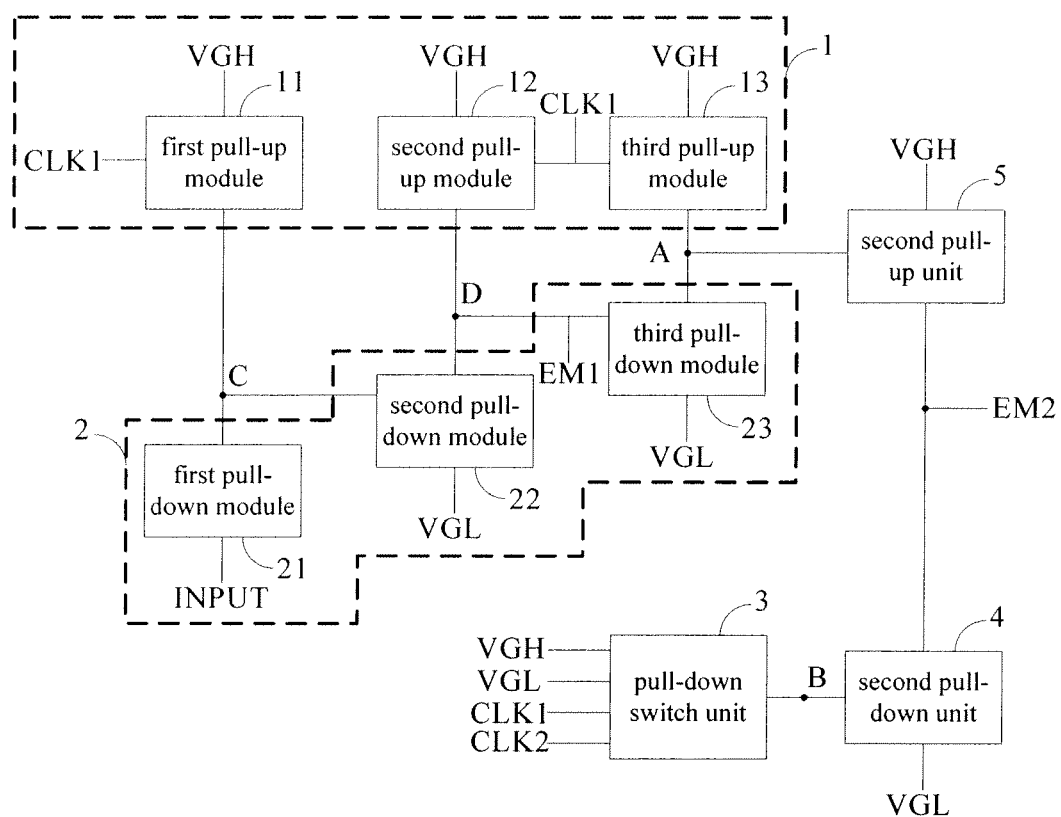
FIG. 2 is a structural schematic diagram of another shift register unit according an embodiment of the present disclosure.

Further, as shown in FIG. 2, in the shift register according to the embodiments of the present disclosure, the first pull-up unit 1 can further comprise:

A first pull-up module 11 connected with the high level end VGH, the first clock signal end CLK1 and a control node C.

A second pull-up module 12 connected with the high level end VGH, the first clock signal end CLK1 and a control node D.

A third pull-up module 13 connected with the high level end VGH, the first clock signal end CLK1 and the control node A.

Correspondingly, the first pull-down unit 2 comprises:

A first pull-down module 21 connected with the input signal end INPUT and the control node C.

A second pull-down module 22 connected with the second clock signal end CLK2, the control node C and the control node D.

A third pull-down module 23 connected with the low level end VGL, the control node D and the control node A.

Wherein the first output end EM1 is connected with the control node D.

The first pull-up module 11 and the first pull-down module 21 determine the magnitude of the level of the control node C, and thus can control the switch state of the second pull-down module 22. Further, the second pull-down module 22 and the second pull-up module 12 together determine the level of the control node D, and thus control the switch state of the third pull-down module 23. The pull-down module 23 and the third pull-up module 13 determine the level of the control node A. The first output end EM1 is used to provided input signal INPUT to a next level shift register.

Figure 3:
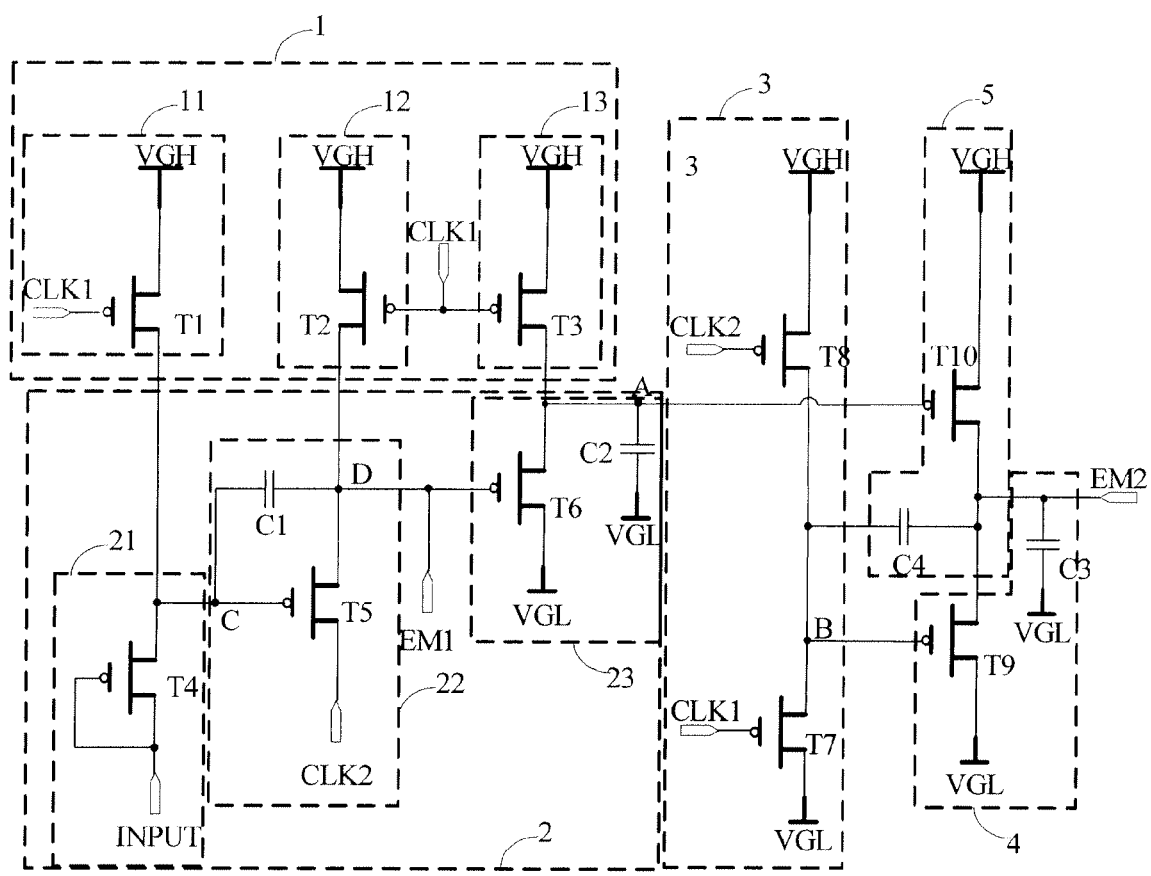
FIG. 3 is a structural schematic diagram of a circuit connection of a shift register unit according an embodiment of the present disclosure.

More further, as shown in FIG. 3, the first pull-up module 11 comprises a first transistor T1 whose gate is connected with the first clock signal end CLK1, whose source is connected with the high level end VGH and whose drain is connected with the control node C.

The second pull-up module 12 comprises a second transistor T2 whose gate is connected with the first clock signal end CLK1, whose source is connected with the high level end VGH and whose drain is connected with the control node D.

The third pull-up module 13 comprises a third transistor T3 whose gate is connected with the first clock signal end CLK1, whose source is connected with the high level end VGH and whose drain is connected with the control node A.

The first pull-down module 21 comprises a fourth transistor T4 whose gate and source are connected with the input signal end INPUT, and whose drain is connected with the control node C.

The second pull-down module 22 comprises a fifth transistor T5 and a first capacitor C2, a gate of the fifth transistor T5 is connected with the control node C, a source of the fifth transistor T5 is connected with the second clock signal end CLK2, a drain of the fifth transistor T5 is connected with the control node D, and two ends of the first capacitor C2 are connected with the gate and the source of the fifth transistor T5, respectively.

The third pull-down module 23 comprises a sixth transistor T6 and a second capacitor C, a gate of the sixth transistor T6 is connected with the control node D, a source of the sixth transistor T6 is connected with the low level end VGL, a drain of the sixth transistor T6 is connected with the control node A, and two ends of the second capacitor C2 are connected with the source and the drain of the sixth transistor T6, respectively. One end of C2 and the source of T6 both connect with low level end.

The pull-down switch unit 3 comprises a seventh transistor T7 and an eighth transistor T8, a gate of the seventh transistor T7 is connected with the first clock signal end CLK1, a source of the seventh transistor T7 is connected with the low level end VGL, a drain of the seventh transistor T7 is connected with the control node B, a gate of the eighth transistor T8 is connected with the second clock signal end CLK2, a source of the eighth transistor T8 is connected with the high level end VGH, and a drain of the eight transistor T8 is connected with the control node B.

The second pull-down unit 4 comprises a ninth transistor T9 and a third capacitor C3, a gate of the ninth transistor T9 is connected with the control node B, a source of the ninth transistor T9 is connected with the low level end VGL, a drain of the ninth transistor T9 is connected with the second output end EM2, and two ends of the third capacitor C3 are connected with the source and the drain of the ninth transistor T9, respectively.

The second pull-up unit 5 comprises a tenth transistor T10 and a fourth capacitor C4, a gate of the tenth transistor T10 is connected with the control node A, a source of the tenth transistor T10 is connected with the high level end VGH, a drain of the tenth transistor T10 is connected with the second output end EM2, and two ends of the fourth capacitor C4 are connected with the drain of the tenth transistor T10 and the drain of the eight transistor T8, respectively.

The shift register unit according to the embodiments of the present disclosure is used to control a driving TFT for driving an OLED device to coordinate with an existing shift register unit for controlling a pixel circuit, control the driving TFT to turn off the driving current of the OLED device when the shift register unit for controlling the pixel circuit writes data into the pixel circuit, and control the driving TFT again to turn on the OLED device when the writing of the data is finished. As such, a problem of flickers can be prevented from occurring in the OLED display device while writing display data, and the product quality of the OLED display device is enhanced.

Figure 4:
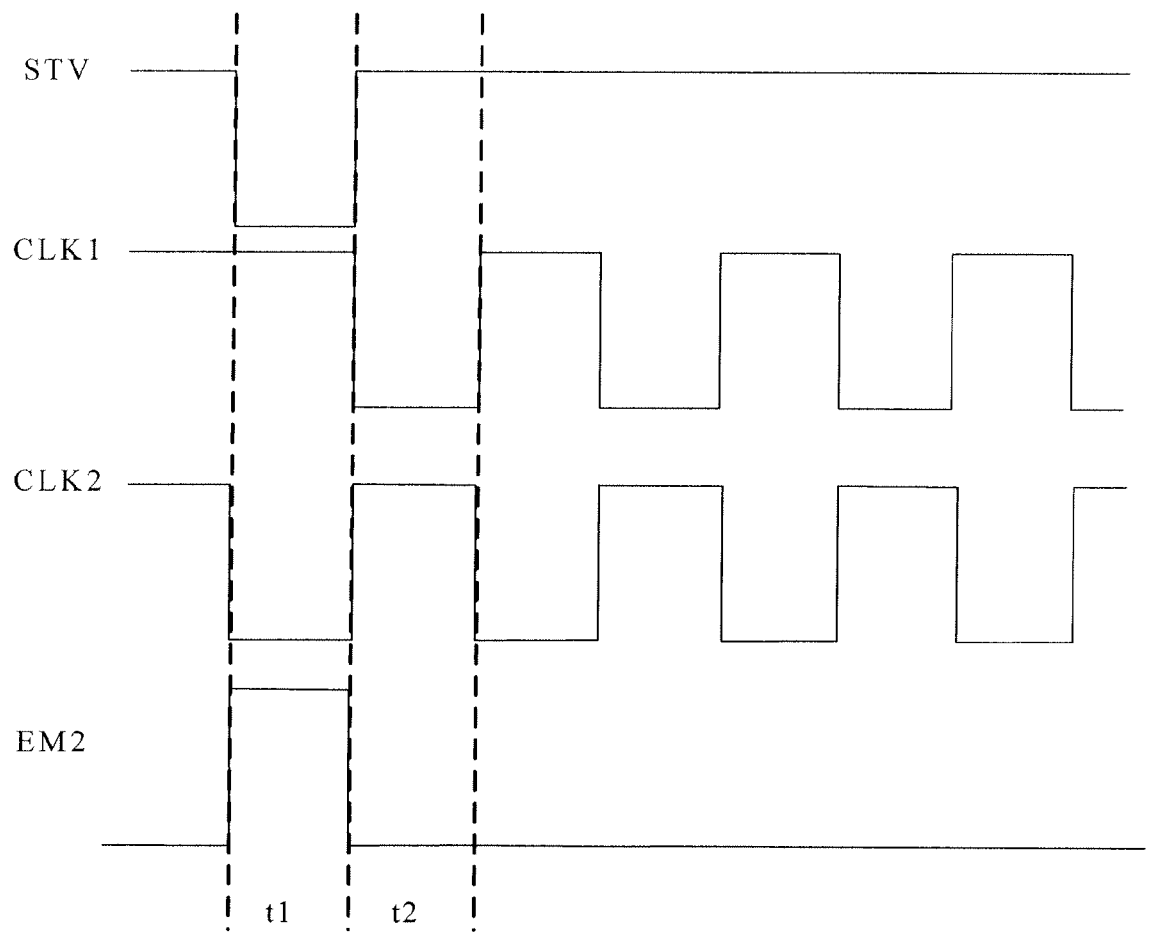
FIG. 4 is a schematic diagram of a clock signal timing state of a shift register unit according an embodiment of the present disclosure.

The work state of the shift register unit according to the embodiments of the present disclosure as shown in FIG. 3 will be described in detail below in conjunction with the timing state diagram shown in FIG. 4.

t1 state: the first clock signal CLK1 is at a high level, and both the signal INPUT (herein, a frame start signal STV is taken as an example of the input signal) and the second clock signal CLK2 are at a low level. At this time, the transistor T4 is turned on, the control node C is pull down, and the transistor T5 is turned on. In the meantime, since the first clock signal CLK1 is at a high level, all of the transistor T1, T2 and T3 are turned off. Therefore, since the transistor T6 is turned on, the second clock signal CLK2 is at a low level, the level of the control node D is at a low level and the first output end EM1 is at a low level at this time. In the meantime, since the transistor T6 is turned on, the level of the control node A is at a low level VGL, then the transistor T10 is turned on, and the second output end EM2 is correspondingly at a high level VGH. In the meantime, since the first clock signal CLK1 is at a high level, the transistors T7 and T9 are turned off, thus ensuring the input of the second output end EM2 is not affected by the transistors T7 and T9. At this time, the second output end EM2 is at a high level, so as to complete the input of the driving current of the OLED device.

t2 stage: both the signal INPUT and the second clock signal CLK2 are at a high level, and the first clock signal CLK1 is at a low level. At this time, the transistor T4 is turned off. In the meantime, since the first clock signal CLK1 is at a low level, the transistors T1, T2 and T3 are all turned on, then the level of the control node D is pulled up to a high level, thus causing that the transistor T6 turned off and the first output end EM1 is at a high level. Since the transistor T3 is turned on, the level of the control node A is at a high level and the transistor T10 is turned off. In the meantime, since the first clock signal CLK1 is at a low level and the second clock signal CLK2 is at a high level at this time, the transistor T7 is turned on, T8 is turned off, the level of the control node B is at a low level, and thus the transistor T9 is turned on. At this time, the output of the second output end EM2 is at a low level, completing resetting of the input.

The embodiments of the present disclosure can be achieved by N type transistors by adjusting the timings of the input signals.

Figure 5:
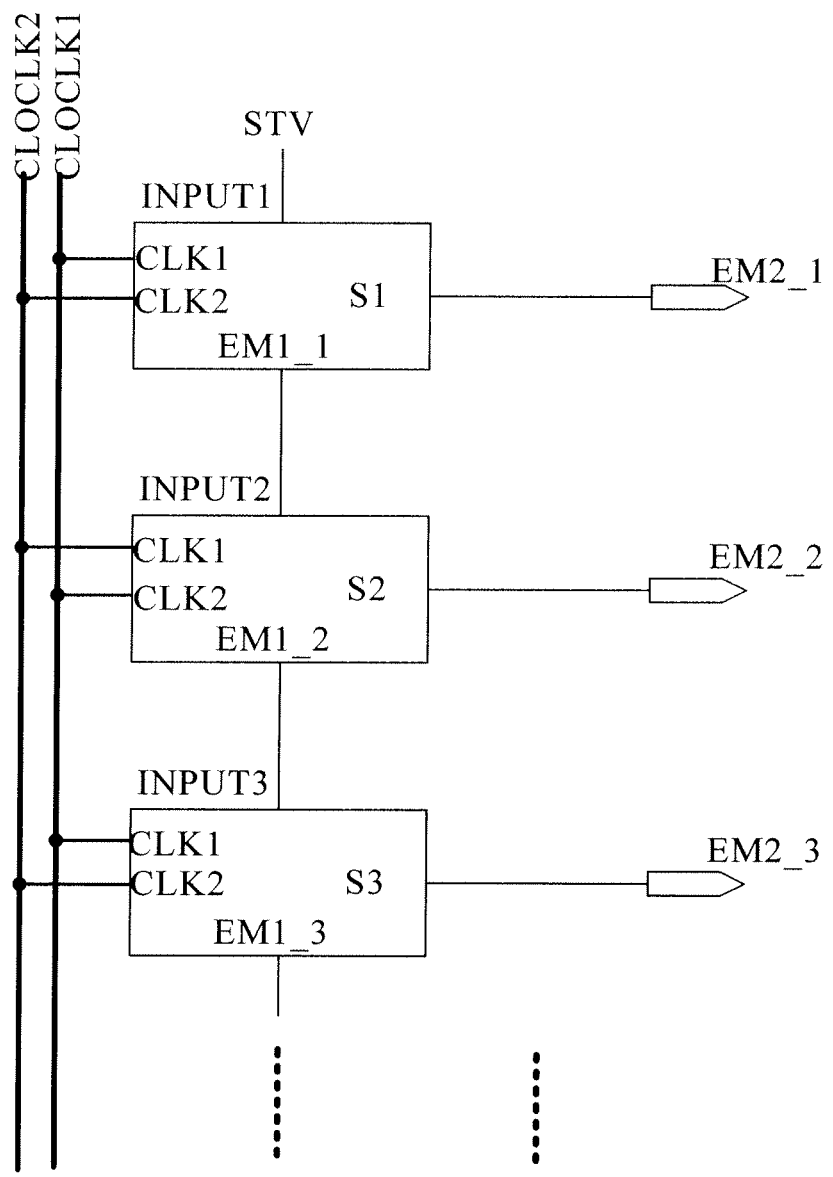
FIG. 5 is a structural schematic diagram of a shift register circuit according an embodiment of the present disclosure.

As shown in FIG. 5, the shift register circuit according to the embodiments of the present disclosure comprises a plurality of the shift register units connected in series.

Except a first shift register unit, an input signal of each of the other shift register units comes from a signal outputted from a first output end of an adjacent shift register unit before the shift register unit.

Specifically, the shift register circuit as shown in FIG. 5 comprises several shift register units connected in series, in which, a first output end EM1_1 of a shift register unit S1 is connected with an input end INPUT2 of a shift register unit S2, its second output end EM2_1 is connected with a gate of a driving TFT, and the driving TFT is used for accurately controlling a driving current of a row of OLED devices; a first output end EM1_2 of a shift register unit S2 is connected with an input end INPUT3 of a shift register unit S3, its second output end EM2_2 is connected with a gate of another driving TFT, and this driving TFT is used for accurately controlling a driving current of another row of OLED devices; the other shift register units are connected according this method, and each shift register unit has a first clock signal end CLK1 and a second clock signal end CLK2, wherein, the first clock signal CLK1 is connected with a system clock signal CLOCLK1, and a second clock signal CLK2 is connected with a system clock signal CLOCLK2. Wherein the duty cycles of low levels of the system clock signals CLOCLK1 and CLOCLK2 are both 1:2, and the low level signal of CLOCLK2 begins after the end of the low level signal of CLOCLK1, the next low level signal of CLOCLK1 begins after the end of the low level signal of CLOCLK2, and such a cycle continues thereafter. In the present embodiment, the first shift register unit is the shift register unit S1, then the input signal INPUT1 of the shift register unit S1 is an active pulse signal, such as optionally the frame start signal STV, at this time, the low level signal of the STV and the system clock signal CLOCLK1 begin simultaneously, and end simultaneously.

Wherein, the shift register unit according to the embodiments of the present disclosure is used to control a driving TFT for driving an OLED device to coordinate with an existing shift register unit for controlling a pixel circuit, control the driving TFT to turn off the driving current of the OLED device when the shift register unit for controlling the pixel circuit writes data into the pixel circuit, and control the driving TFT again to turn on the OLED device when the writing of the data is finished. As such, a problem of flickers can be prevented from occurring in the OLED display device while writing display data, and the product quality of the OLED display device is enhanced.

Figure 6:
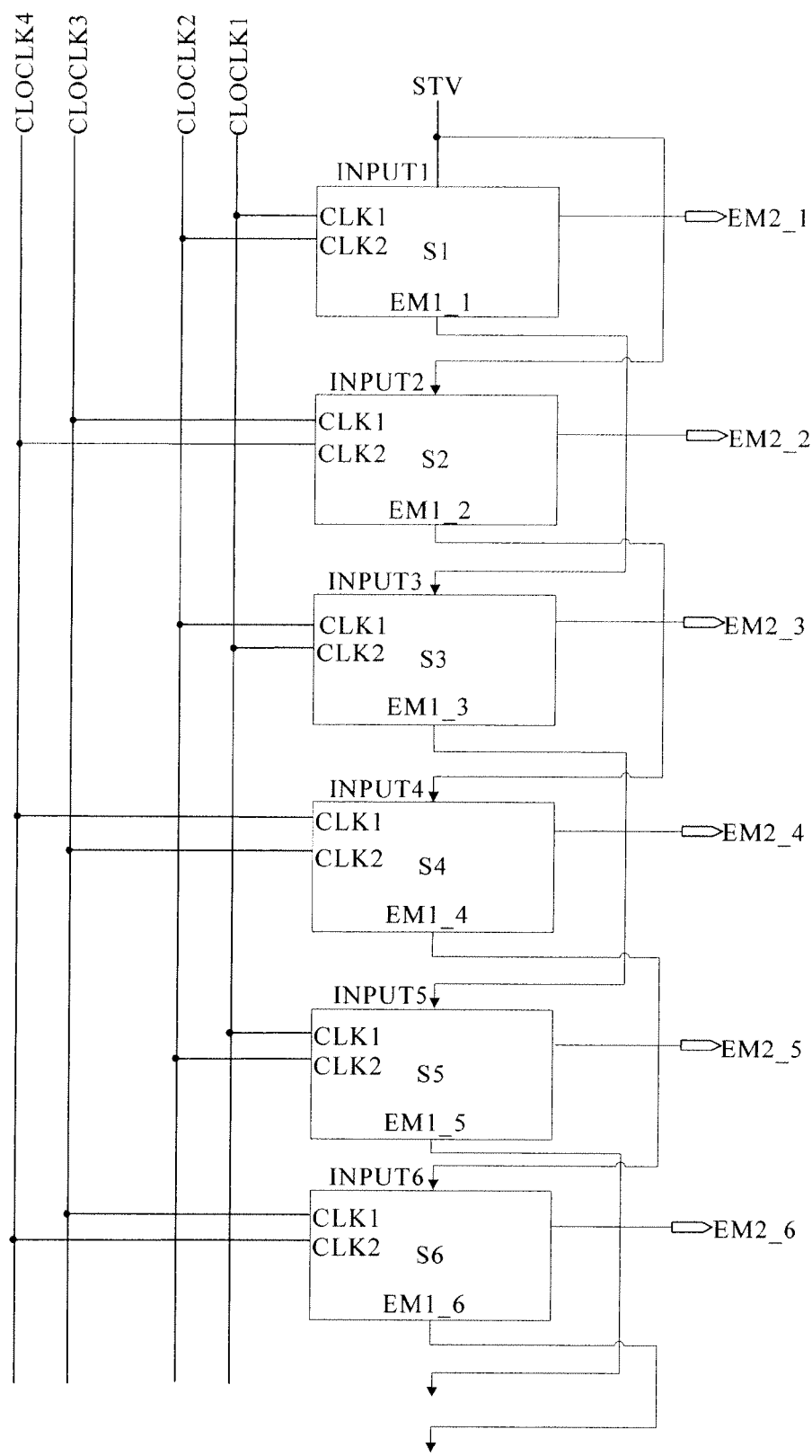
FIG. 6 is a structural schematic diagram of another shift register circuit according an embodiment of the present disclosure.

Further, as shown in FIG. 6, the shift register circuit comprises a first shift register unit set and a second shift register unit set, each of the shift register unit sets comprises a plurality of the shift register units connected in series.

In each of the shift register unit sets, except a first shift register unit, an input signal of each of the other shift register units comes from a signal outputted from a first output end of an adjacent shift register unit before the shift register unit.

Specifically, in the shift register circuit as shown in FIG. 6, the shift register units S1, S3, S5 . . . are the first shift register unit set, and shift register units S2, S4, S6, . . . are the second shift register set. Refer to FIG. 5 for the connection of each of the shift register unit sets.

Wherein, clock signals inputted into the first shift register unit set comprise a first clock signal and a second clock signal.

Clock signals inputted into the second shift register unit set comprise a third clock signal and a fourth clock signal.

Figure 7:
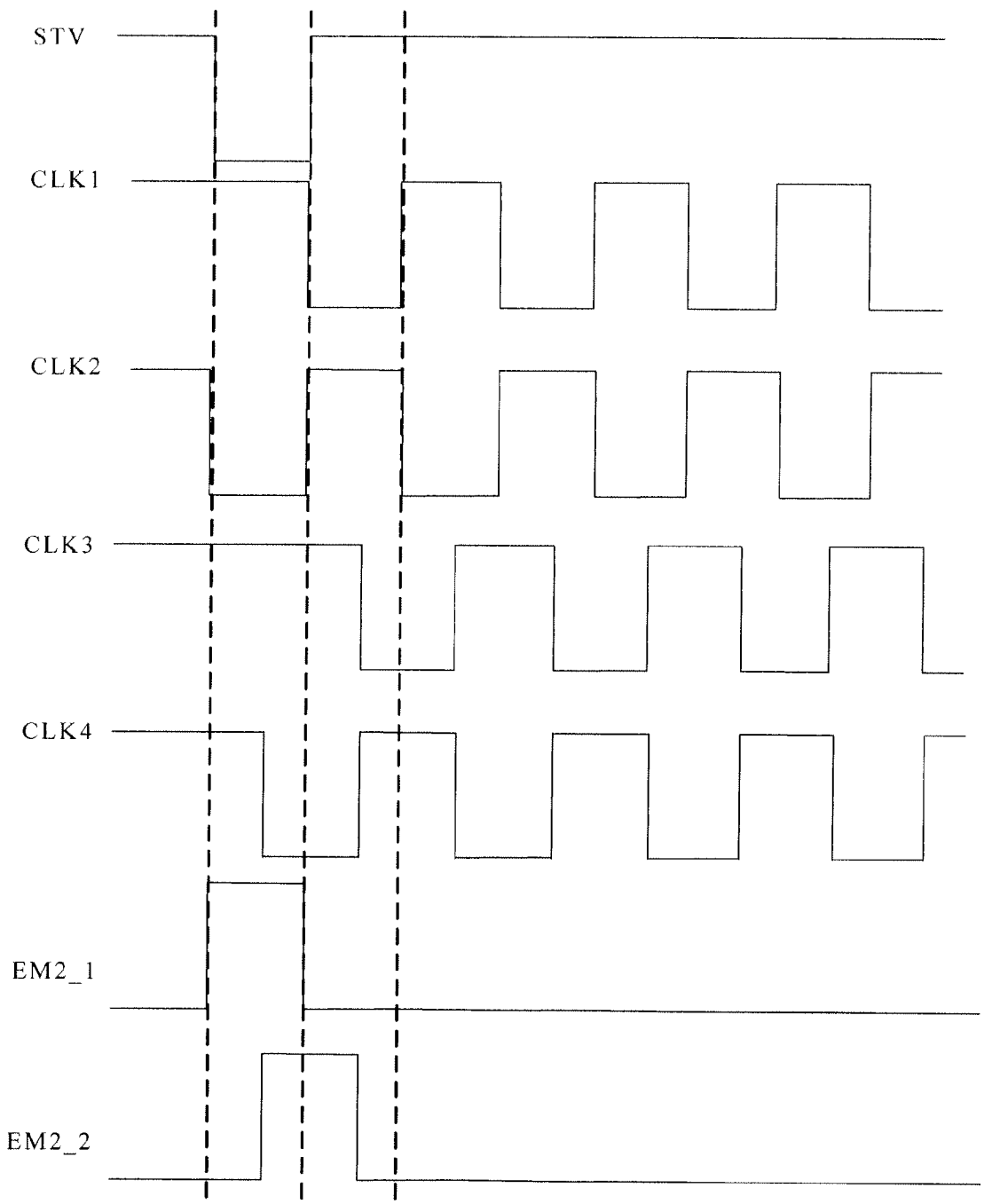
FIG. 7 is a schematic diagram of a clock signal timing state of another shift register unit according an embodiment of the present disclosure.

Specifically, the timing state of the shift register circuit according to the embodiments of the present disclosure can be as shown in FIG. 7. Wherein, the first clock signal CLK1 is a half clock period apart from the third clock signal CLK3, the second clock signal CLK2 is a half clock period apart from the fourth clock signal CLK4. A control signal using such a timing can effectively separate out a time slot between each level of shift register circuits, thus avoiding interferences of current between the shift register circuits.

In addition, the embodiments of the present disclosure provides an array substrate, on which are formed a shift register circuits, and the shift register circuit is the above mentioned shift register circuit.

By using such an array substrate, the shift register unit is used to control a driving TFT for driving an OLED device to coordinate with an existing shift register unit for controlling a pixel circuit, control the driving TFT to turn off the driving current of the OLED device when the shift register unit for controlling the pixel circuit writes data into the pixel circuit, and control the driving TFT again to turn on the OLED device when the writing of the data is finished. As such, a problem of flickers can be prevented from occurring in the OLED display device while writing display data, and the product quality of the OLED display device is enhanced.

The embodiment of the present disclosure further provides a display device, such as a display panel, comprising: OLED display means for displaying an image.

A shift register circuit for driving the OLED display means.

The shift register circuit is the above mentioned shift register circuit.

A display device provided by the embodiment of the present disclosure includes a shift register circuit. Wherein, the shift register unit is used to control a driving TFT for driving an OLED device to coordinate with an existing shift register unit for controlling a pixel circuit, control the driving TFT to turn off the driving current of the OLED device when the shift register unit for controlling the pixel circuit writes data into the pixel circuit, and control the driving TFT again to turn on the OLED device when the writing of the data is finished. As such, a problem of flickers can be prevented from occurring in the OLED display device while writing display data, and the product quality of the OLED display device is enhanced.

What is described is merely the specific mode for implementing the present disclosure, but the protection scope of the present disclosure is not limited thereto. Variations or alternations occurred to any skilled in the art within the technical scope disclosed by the present disclosure should be covered by the protection scope of the present disclosure. Therefore, the protection scope of the present disclosure is subject to the protection scope of the claims.

The invention claimed is:

1. A shift register unit comprising:
a first pull-up unit connected with a high level end, a first clock signal end and a first control node (A);
a first pull-down unit connected with a low level end, a second clock signal end, an input signal end, the first pull-up unit, a first output end and the first control node (A);
a pull-down switch unit connected with the high level end, the low level end, the first clock signal end, the second clock signal end and a second control node (B);
a second pull-down unit connected with the low level end, the second control node (B) and a second output end; and
a second pull-up unit connected with the high level end, the first control node (A) and the second output end;
wherein, the first pull-up unit is used to pull up a level of the first control node (A) when a low level is inputted into the first clock signal end; the first pull-down unit is used to pull down the level of the first control node (A) when a low level is inputted into both of the second clock signal end and the input signal end; the pull-down switch unit is used to pull down a level of the second control node (B) when a low level is inputted into the first clock signal end, and pull up the level of the second control node (B) when a low level is inputted into the second clock signal end; the second pull-up unit is used to pull up a level outputted from the second output end when the first control node (A) is at a low level, to output a driving signal; and the second pull-down unit is used to pull down the level outputted from the second output end when the second control node (B) is at a low level, to reset the driving signal,
wherein the first pull-up unit comprises:
a first pull-up module connected with the high level end, the first clock signal end and a third control node (C);
a second pull-up module connected with the high level end, the first clock signal end and a fourth control node (D); and
a third pull-up module connected with the high level end, the first clock signal end and the first control node (A),
the first pull-down unit comprises:
a first pull-down module connected with the input signal end and the third control node (C);
a second pull-down module connected with the second clock signal end, the third control node (C) and the fourth control node (D); and
a third pull-down module connected with the low level end, the fourth control node (D) and the first control node (A), and
wherein the first output end is connected with the fourth control node (D),
wherein the first pull-up module comprises a first transistor having a gate connected with the first clock signal end, having a source connected with the high level end and having a drain connected with the third control node (C);
the second pull-up module comprises a second transistor having a gate connected with the first clock signal end, having a source connected with the high level end and having a drain connected with the fourth control node (D);
the third pull-up module comprises a third transistor having a gate connected with the first clock signal end, having a source connected with the high level end and having a drain connected with the first control node (A);
the first pull-down module comprises a fourth transistor having a gate and source connected with the input signal end, and having a drain connected with the third control node (C);
the second pull-down module comprises a fifth transistor and a first capacitor, a gate of the fifth transistor is connected with the third control node (C), a source of the fifth transistor is connected with the second clock signal end, a drain of the fifth transistor is connected with the fourth control node (D), and two ends of the first capacitor are connected with the gate and the source of the fifth transistor, respectively;

the third pull-down module comprises a sixth transistor and a second capacitor, a gate of the sixth transistor is connected with the fourth control node (D), a source of the sixth transistor is connected with the low level end, a drain of the sixth transistor is connected with the first control node (A), and two ends of the second capacitor are connected with the source and the drain of the sixth transistor, respectively;

the pull-down switch unit comprises a seventh transistor and an eighth transistor, a gate of the seventh transistor is connected with the first clock signal end, a source of the seventh transistor is connected with the low level end, a drain of the seventh transistor is connected with the second control node (B), a gate of the eighth transistor is connected with the second clock signal end, a source of the eighth transistor is connected with the high level end, and a drain of the eight transistor is connected with the second control node (B);

the second pull-down unit comprises a ninth transistor and a third capacitor, a gate of the ninth transistor is connected with the second control node (B), a source of the ninth transistor is connected with the low level end, a drain of the ninth transistor is connected with the second output end, and two ends of the third capacitor are connected with the source and the drain of the ninth transistor, respectively; and the second pull-up unit comprises a tenth transistor and a fourth capacitor, a gate of the tenth transistor is connected with the first control node (A), a source of the tenth transistor is connected with the high level end, a drain of the tenth transistor is connected with the second output end, and two ends of the fourth capacitor are connected with the drain of the tenth transistor and the drain of the eighth transistor, respectively, wherein, at a first stage, a first clock signal is at a high level, and both an input signal and a second clock signal are at a low level, at this time, the fourth transistor is turned on, the third control node (C) is pull down, and the fifth transistor is turned on, in the meantime, since the first clock signal is at a high level, all of the first transistor, the second transistor and the third transistor are turned off, therefore, since the sixth transistor is turned on, the second clock signal is at a low level, the level of the fourth control node (D) is at a low level and the first output end is at a low level at this time, in the meantime, since the sixth transistor is turned on, the level of the first control node (A) is at a low level, then the tenth transistor is turned on, and the second output end is correspondingly at a high level, in the meantime, since the first clock signal is at a high level, the seventh transistor and the ninth transistor are turned off, thus ensuring the input of the second output end is not affected by the seventh transistor and the ninth transistor, at this time, the second output end is at a high level, to output a driving signal; and wherein, at a second stage, both the input signal and the second clock signal are at a high level, and the first clock signal is at a low level, at this time, the fourth transistor is turned off, in the meantime, since the first clock signal is at a low level, the first transistor, the second transistor and the third transistor are all turned on, then the level of the fourth control node (D) is pulled up to a high level, thus causing that the sixth transistor turned off and the first output end is at a high level, since the third transistor is turned on, the level of the first control node (A) is at a high level and the tenth transistor is turned off, in the meantime, since the first clock signal is at a low level and the second clock signal is at a high level at this time, the seventh transistor is turned on, the eighth transistor is turned off, the level of the second control node (B) is at a low level, and thus the ninth transistor is turned on, at this time the output of the second output end is at a low level, to reset the driving signal.

2. A shift register circuit comprising a plurality of the shift register units of claim 1, connected in series,
except a first shift register unit, an input signal of each of the other shift register units comes from a signal outputted from a first output end of an adjacent shift register unit before the shift register unit.

3. The shift register circuit according to claim 2, wherein the shift register circuit comprises a first shift register unit set and a second shift register set, each of the shift register unit sets comprises a plurality of the shift register units connected in series,
in each of the shift register unit sets, except a first shift register unit, an input signal of each of the other shift register units comes from a signal outputted from a first output end of an adjacent shift register unit before the shift register unit;
clock signals inputted into the first shift register unit set comprise a first clock signal and a second clock signal; and
clock signals inputted into the second shift register unit set comprise a third clock signal and a fourth clock signal.

4. The shift register circuit according to claim 3, wherein the first clock signal is a half clock period apart from the third clock signal; and
the second clock signal is a half clock period apart from the fourth clock signal.

5. A display device, comprising:
OLED display means for displaying an image; and
a shift register circuit for driving the OLED display means,
wherein, the shift register circuit is the shift register circuit according to claim 2.

6. The display device according to claim 5, wherein the shift register circuit comprises a first shift register unit set and a second shift register set, each of the shift register unit sets comprises a plurality of the shift register units connected in series,
in each of the shift register unit sets, except a first shift register unit, an input signal of each of the other shift register units comes from a signal outputted from a first output end of an adjacent shift register unit before the shift register unit;
clock signals inputted into the first shift register unit set comprise a first clock signal and a second clock signal; and
clock signals inputted into the second shift register unit set comprise a third clock signal and a fourth clock signal.

7. The display device according to claim 6, wherein
the first clock signal is a half clock period apart from the third clock signal; and
the second clock signal is a half clock period apart from the fourth clock signal.

* * * * *